(12) United States Patent
Inaba

(10) Patent No.: US 11,679,976 B2
(45) Date of Patent: Jun. 20, 2023

(54) STRUCTURE FORMING METHOD AND DEVICE

(71) Applicant: SEIKO EPSON CORPORATION, Tokyo (JP)

(72) Inventor: Shogo Inaba, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 706 days.

(21) Appl. No.: 16/776,098

(22) Filed: Jan. 29, 2020

(65) Prior Publication Data

US 2020/0247666 A1 Aug. 6, 2020

(30) Foreign Application Priority Data

Jan. 31, 2019 (JP) .............................. JP2019-015603

(51) Int. Cl.
*G01P 15/125* (2006.01)
*B81C 1/00* (2006.01)
*B81B 3/00* (2006.01)

(52) U.S. Cl.
CPC ........ *B81C 1/00515* (2013.01); *G01P 15/125* (2013.01); *B81B 3/0021* (2013.01); *B81B 2201/0235* (2013.01); *B81B 2203/0118* (2013.01); *B81B 2203/0353* (2013.01); *B81B 2203/04* (2013.01); *B81C 2201/0112* (2013.01); *B81C 2201/0132* (2013.01); *B81C 2201/0142* (2013.01)

(58) Field of Classification Search
CPC ......... B81C 1/00515; B81C 2201/0112; B81C 2201/0132; B81C 2201/0142; B81C 1/00087; B81C 1/00404; B81C 1/00531; G01P 15/125; G01P 15/0802; G01P 2015/0831; B81B 3/0021; B81B 2201/0235; B81B 2203/0118; B81B 2203/0353; B81B 2203/04; H01L 21/30655
See application file for complete search history.

(56) References Cited

U.S. PATENT DOCUMENTS

| | | | |
|---|---|---|---|
| 6,284,148 B1 | 9/2001 | Laermer et al. | |
| 6,450,029 B1 | 9/2002 | Sakai et al. | |
| 2003/0176071 A1* | 9/2003 | Oohara | G01P 15/0802 438/707 |

(Continued)

FOREIGN PATENT DOCUMENTS

| | | |
|---|---|---|
| JP | H07-140242 | 6/1995 |
| JP | 2001-091535 | 4/2001 |

(Continued)

*Primary Examiner* — David J Bolduc
(74) *Attorney, Agent, or Firm* — Workman Nydegger

(57) ABSTRACT

A structure forming method according to an aspect is a structure forming method for forming a first hole and a second hole having width smaller than width of the first hole in a substrate with dry etching and forming a structure. The structure forming method includes forming an etching mask on the substrate, etching a portion of the etching mask overlapping a first hole forming region where the first hole is formed, etching a portion of the etching mask overlapping a second hole forming region where the second hole is formed, and performing the dry etching of the substrate using the etching mask as a mask.

7 Claims, 14 Drawing Sheets

(56) References Cited

U.S. PATENT DOCUMENTS

| | | | |
|---|---|---|---|
| 2004/0023508 A1* | 2/2004 | Chinn | H01L 21/30655 438/714 |
| 2004/0097077 A1* | 5/2004 | Nallan | H01L 21/30655 438/689 |
| 2006/0008935 A1* | 1/2006 | Asai | B81C 1/00626 438/50 |
| 2006/0037937 A1* | 2/2006 | Mitsugi | H01L 21/3085 216/37 |
| 2006/0213268 A1* | 9/2006 | Asami | G01P 15/0802 73/514.16 |
| 2007/0068266 A1 | 3/2007 | Fujimori et al. | |
| 2009/0242512 A1* | 10/2009 | Beaudry | H01L 21/30655 216/49 |
| 2010/0112743 A1* | 5/2010 | Kawauchi | G01P 15/0802 257/E21.214 |
| 2011/0140216 A1* | 6/2011 | Qu | B81C 1/00952 257/E21.573 |
| 2011/0207323 A1* | 8/2011 | Ditizio | H01L 21/02271 257/E21.597 |
| 2012/0074527 A1* | 3/2012 | Casset | B81C 1/00246 438/666 |
| 2012/0322268 A1* | 12/2012 | Kim | H01L 23/5283 257/E21.214 |
| 2013/0099292 A1* | 4/2013 | Nakatani | H01L 25/071 438/51 |
| 2013/0237062 A1* | 9/2013 | Winniczek | B81C 1/00619 438/719 |
| 2014/0017902 A1* | 1/2014 | Mori | H01L 21/3212 510/176 |
| 2015/0336793 A1* | 11/2015 | Torkkeli | B81C 1/00396 438/50 |
| 2016/0246010 A1* | 8/2016 | Medhat | C23C 16/042 |
| 2016/0322306 A1* | 11/2016 | Roesner | H01L 21/30655 |
| 2016/0332867 A1* | 11/2016 | Tseng | B81B 7/02 |
| 2016/0332872 A1* | 11/2016 | Iihola | G01C 19/5733 |
| 2017/0309468 A1* | 10/2017 | Shirai | C11D 7/3209 |
| 2017/0330798 A1* | 11/2017 | Horie | H01L 21/31144 |
| 2017/0339494 A1* | 11/2017 | Perletti | H04R 19/005 |
| 2017/0363424 A1* | 12/2017 | Maspero | B81B 3/0045 |
| 2018/0086627 A1* | 3/2018 | Lin | B81B 7/007 |
| 2018/0166293 A1* | 6/2018 | Tsai | H01L 21/3081 |
| 2018/0346326 A1* | 12/2018 | Fujii | B81C 1/00587 |
| 2019/0101566 A1* | 4/2019 | Inaba | G01C 19/5628 |
| 2019/0157095 A1* | 5/2019 | Zhou | C23C 16/401 |
| 2019/0161342 A1* | 5/2019 | Tai | B81B 7/02 |
| 2019/0256350 A1* | 8/2019 | Meng | B81C 1/00063 |
| 2020/0156111 A1* | 5/2020 | Gross | B81B 3/0086 |
| 2020/0207609 A1* | 7/2020 | Atnip | G02B 26/0833 |
| 2021/0159082 A1* | 5/2021 | Lutker-Lee | H01L 21/0332 |

FOREIGN PATENT DOCUMENTS

| | | |
|---|---|---|
| JP | 2006-156850 | 6/2006 |
| JP | 2007-086002 | 4/2007 |
| JP | 2010-009001 | 1/2010 |
| JP | 2010-287823 | 12/2010 |
| WO | 2017-072897 | 5/2017 |

* cited by examiner

STRUCTURE FORMING METHOD AND DEVICE

The present application is based on, and claims priority from JP Application Serial Number 2019-015603, filed Jan. 31, 2019, the disclosure of which is hereby incorporated by reference herein in its entirety.

BACKGROUND

1. Technical Field

The present disclosure relates to a structure forming method and a device.

2. Related Art

For example, as described in U.S. Pat. No. 6,284,148 (Patent Literature 1), there has been known a Bosch process as a deep groove etching technique for silicon. The Bosch process is a technique for alternately switching gas in two systems, that is, $SF_6$, which is an etching gas, and $C_4F_8$, which is a gas for sidewall protection film formation, and alternately repeating an etching step and a sidewall protection film forming step to thereby form a deep groove in silicon. With such a deep groove etching technique, it is possible to forma groove excellent in verticality of a groove side surface and having a high aspect ratio.

For example, when the Bosch process is applied under the presence of sparseness and density in a pattern, etching speed increases in a sparse portion of the pattern and decreases in a dense portion of the pattern. If the etching speed is different in the sparse portion of the pattern and the dense portion of the pattern in this way, it is likely that etching ends early in the sparse portion of the pattern when the etching is performed according to the etching speed of the dense portion of the pattern and the periphery of the sparse portion of the pattern is damaged. Further, it is likely that the etching does not completely end in the dense portion of the pattern when the etching is performed according to the etching speed in the sparse portion of the pattern.

SUMMARY

A structure forming method according to an aspect of the present disclosure is a structure forming method for forming a first hole and a second hole having width smaller than width of the first hole in a substrate with dry etching and forming a structure, the structure forming method including: forming an etching mask on the substrate; etching a portion of the etching mask overlapping a first hole forming region where the first hole is formed; etching a portion of the etching mask overlapping a second hole forming region where the second hole is formed, and performing the dry etching of the substrate using the etching mask as a mask.

DESCRIPTION OF EXEMPLARY EMBODIMENTS

A structure forming method and a structure according to the present disclosure are explained in detail below based on embodiments shown in the accompanying drawings.

First Embodiment

Figure 1:
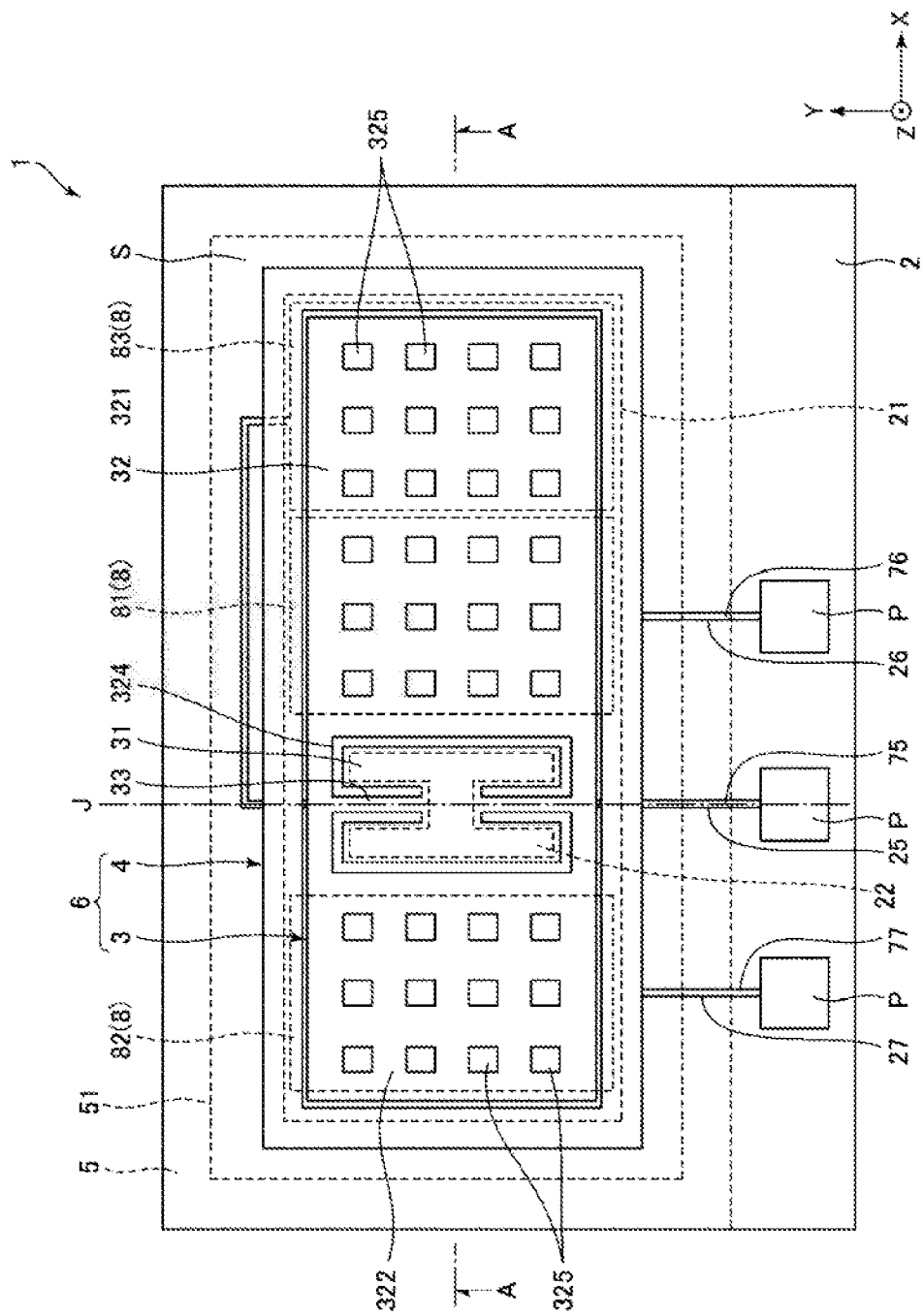
FIG. 1 is a plan view showing an inertial sensor according to a first embodiment.
Figure 2:
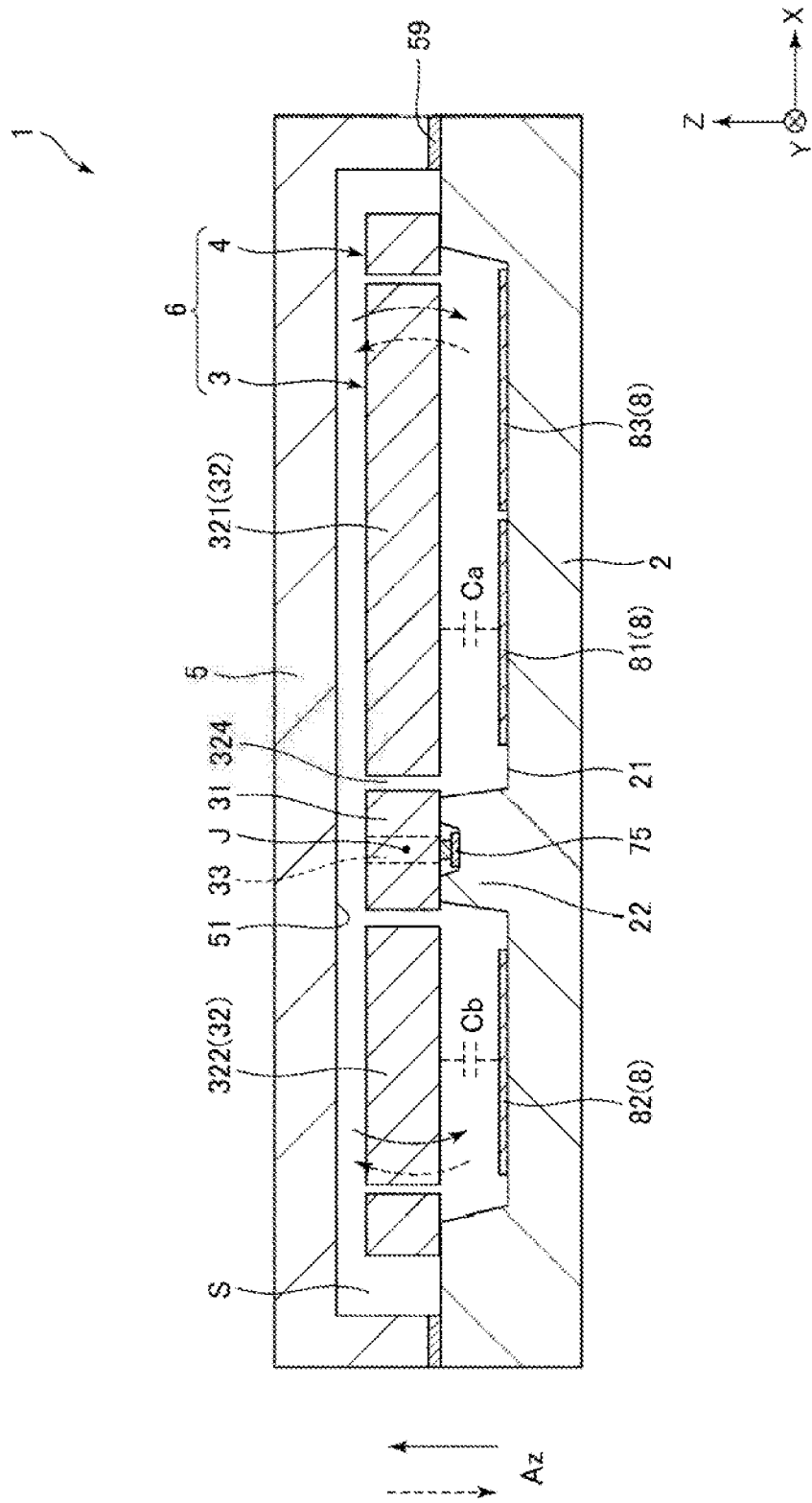
FIG. 2 is a sectional view taken along an A-A line in FIG. 1.
Figure 6:
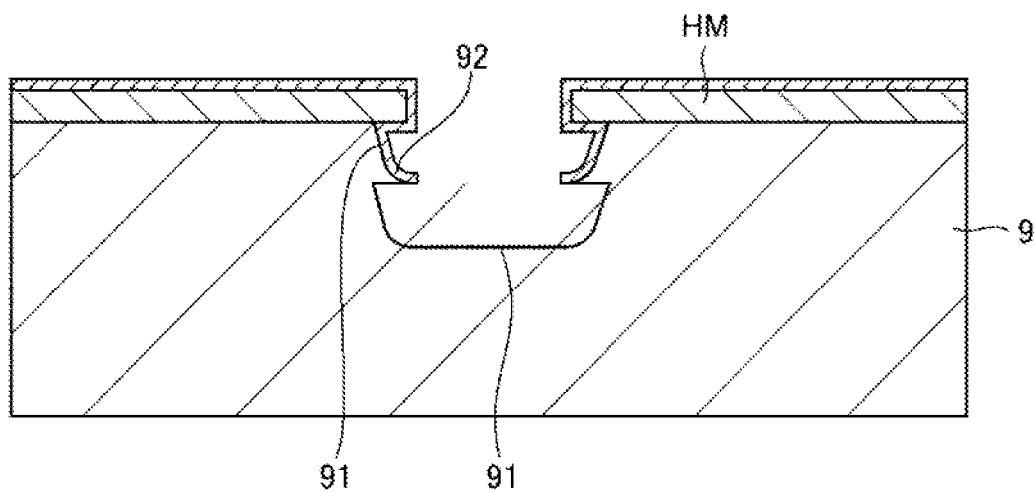
FIG. 6 is a sectional view for explaining the Bosch process.
Figure 7:
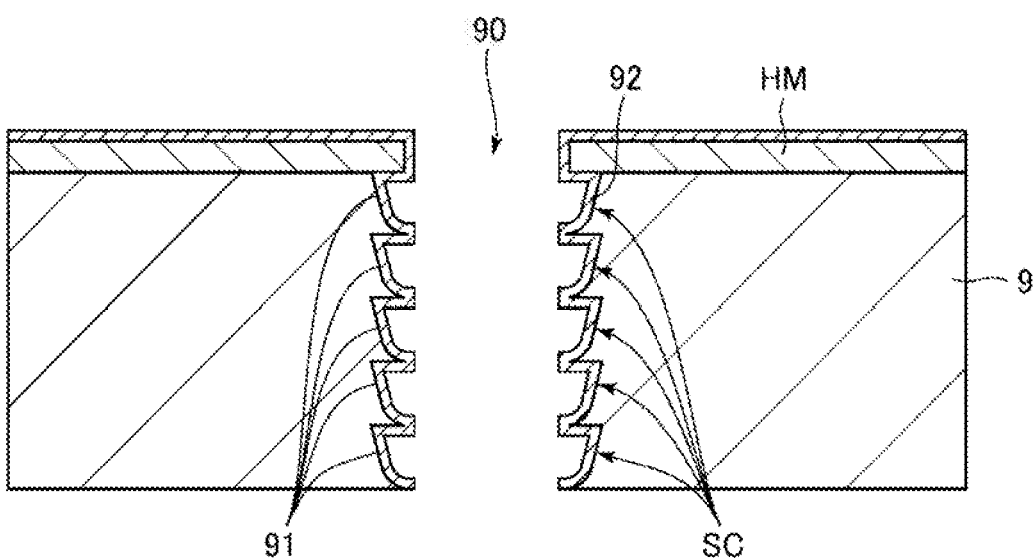
FIG. 7 is a sectional view for explaining the Bosch process.
Figure 8:
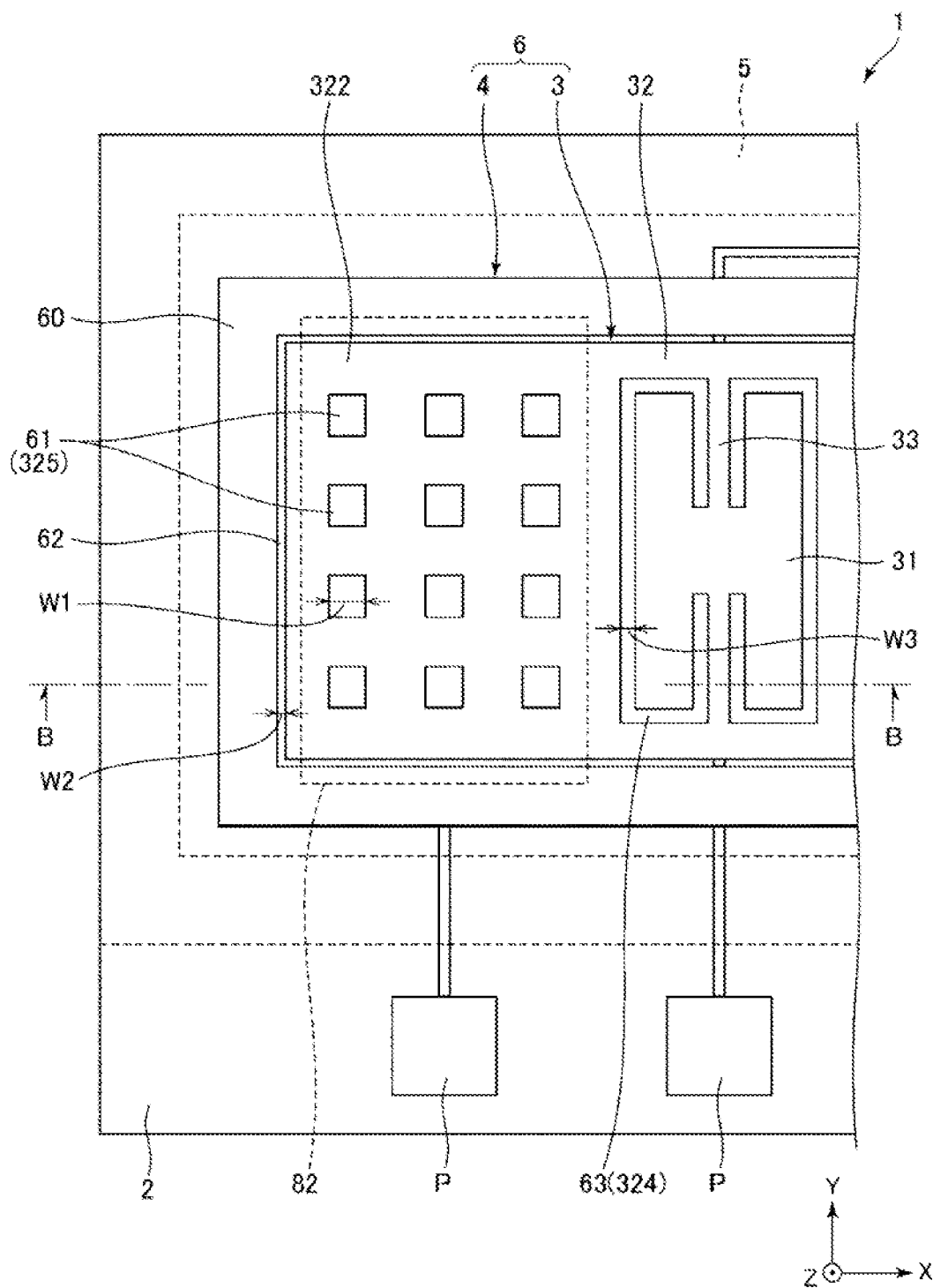
FIG. 8 is a partially enlarged plan view of a structure.
Figure 9:
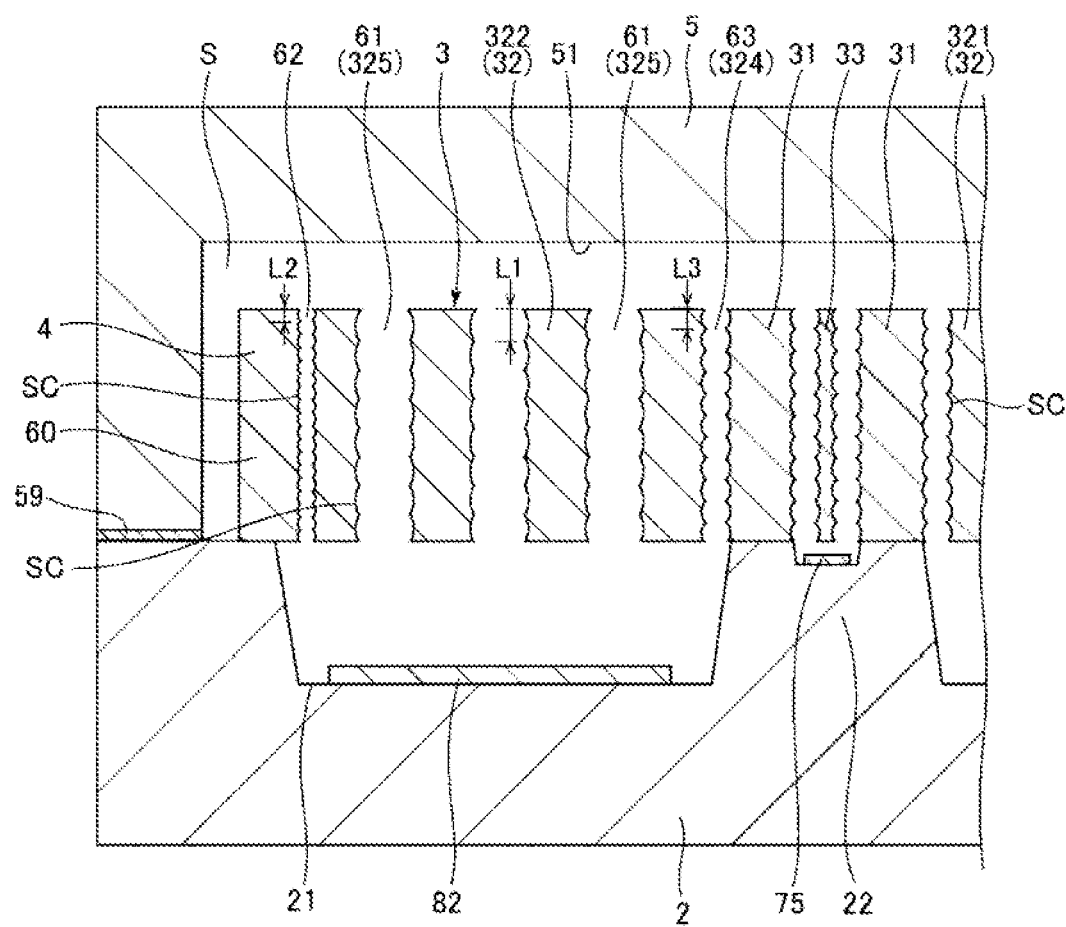
FIG. 9 is a sectional view taken along a B-B line in FIG. 8.
Figure 10:
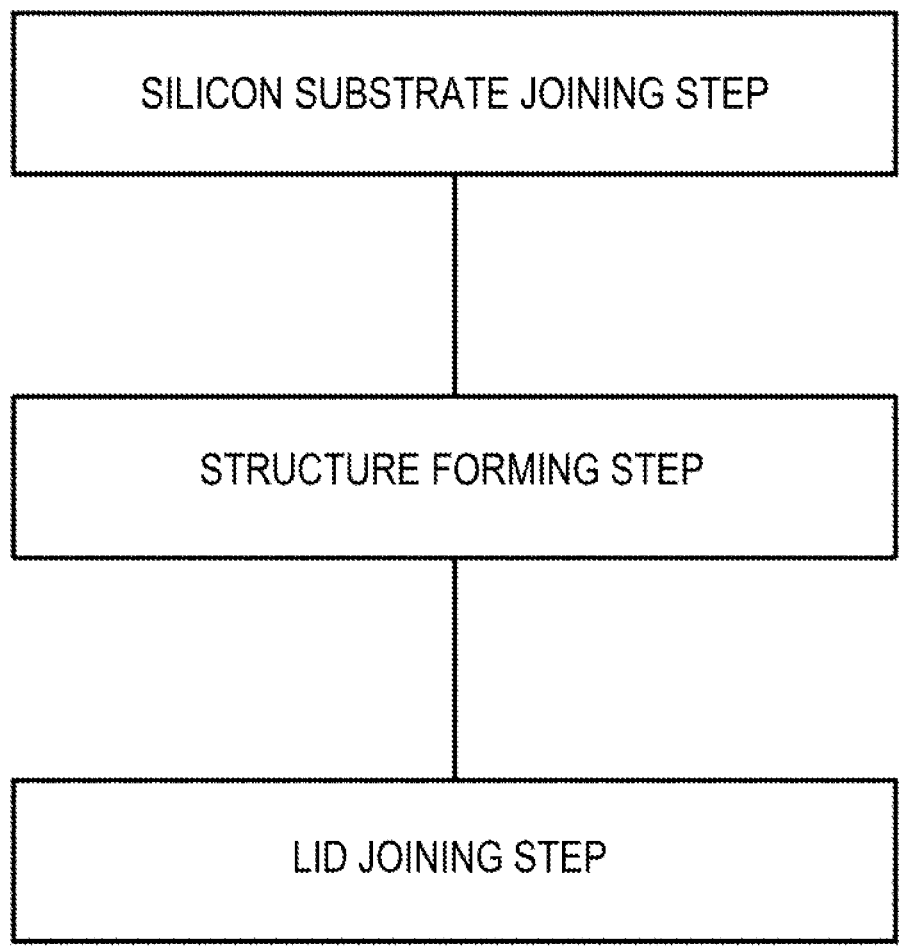
FIG. 10 is a diagram showing a manufacturing process for the inertial sensor.

FIG. 1 is a plan view showing an inertial sensor according to a first embodiment. FIG. 2 is a sectional view taken along an A-A line in FIG. 1. FIGS. 3 to 7 are respectively sectional views for explaining a Bosch process. FIG. 8 is a partially enlarged plan view of a structure. FIG. 9 is a sectional view taken along a B-B line in FIG. 8. FIG. 10 is a diagram showing a manufacturing process for the inertial sensor.

FIGS. 11 to 21 are respectively sectional views for explaining a manufacturing method for the inertial sensor.

In the following explanation, for convenience of explanation, three axes orthogonal to one another are represented as an X axis, a Y axis, and a Z axis. A direction along the X axis, that is, a direction parallel to the X axis is referred to as "X-axis direction" as well, a direction parallel to the Y axis is referred to as "Y-axis direction" as well, and a direction parallel to the Z axis is referred to as "Z-axis direction" as well. An arrow direction distal end side of the axes is referred to as "plus side" as well and the opposite side is referred to as "minus side" as well. A Z-axis direction plus side is referred to as "upper" and a Z-axis direction minus side is referred to as "lower". In this specification, "orthogonal" includes, besides the axes crossing at 90°, the axes crossing at an angle slightly tilting from 90°, for example, the axes crossing in a range of, for example, approximately 90°+5°. Similarly, "parallel" includes, besides the axes forming an angle of 0°, the axes having a difference within a range of approximately ±5°.

An inertial sensor 1 shown in FIG. 1 applied with a device according to the present disclosure is an acceleration sensor that detects acceleration Az in the Z-axis direction. Such an inertial sensor 1 includes a substrate 2, a structure 6 disposed on the substrate 2, and a lid 5 joined to the substrate 2 to cover the structure 6. The structure 6 includes a sensor element 3 and a stopper 4 that suppresses unnecessary displacement of the sensor element 3. As explained below, the sensor element 3 and the stopper 4 are collectively formed by patterning a conductive silicon substrate with a Bosch process, which is a deep groove etching technique.

As shown in FIG. 1, the substrate 2 includes a recess 21 opened to the upper surface side. In a plan view from the Z-axis direction, the recess 21 is formed larger than the sensor element 3 to include the sensor element 3 on the inner side. As shown in FIG. 2, the substrate 2 includes a mount 22 having a protrusion shape provided to project from the bottom surface of the recess 21. The sensor element 3 is joined to the upper surface of the mount 22. As shown in FIG. 1, the substrate 2 includes grooves 25, 26, and 27 opened to the upper surface side.

As the substrate 2, a glass substrate configured by a glass material including an alkali metal ion, which is a movable ion such as Na+, for example, borosilicate glass such as Pyrex glass or Tempax glass (both of which are registered trademarks) can be used. However, the substrate 2 is not particularly limited. For example, a silicon substrate or a ceramic substrate may be used.

As shown in FIGS. 1 and 2, electrodes 8 are provided on the substrate 2. The electrodes 8 include a first fixed detection electrode 81, a second fixed detection electrode 82, and a dummy electrode 83 disposed on the bottom surface of the recess 21. The substrate 2 includes wires 75, 76, and 77 disposed in the grooves 25, 26, and 27.

One end portions of the wires 75, 76, and 77 are exposed to the outside of the lid 5 and function as electrode pads P that perform electric coupling to external devices. The wire 75 is electrically coupled to the sensor element 3, the stopper 4, and the dummy electrode 83. The wire 76 is electrically coupled to the first fixed detection electrode 81. The wire 77 is electrically coupled to the second fixed detection electrode 82.

As shown in FIG. 2, the lid 5 includes a recess 51 opened to the lower surface side. The lid 5 is joined to the upper surface of the substrate 2 to house the sensor element 3 and the stopper 4 in the recess 51. A housing space S for housing the sensor element 3 and the stopper 4 is formed by the lid 5 and the substrate 2 on the inner side thereof. The housing space S is an airtight space. An inert gas such as nitrogen, helium, or argon is encapsulated in the housing space S. The housing space S desirably has a substantially atmospheric pressure at a working temperature (approximately −40° to 120°). However, the atmosphere in the housing space S is not particularly limited and may be, for example, a decompressed state or may be a pressurized state.

As the lid 5, for example, a silicon substrate can be used. However, the lid 5 is not particularly limited. For example, a glass substrate or a ceramic substrate may be used. A joining method for the substrate 2 and the lid 5 is not particularly limited. The joining method only has to be selected as appropriate according to materials of the substrate 2 and the lid 5. For example, anodic joining, activation joining for joining surfaces activated by plasma radiation, joining by a joining material such as glass frit, or diffused joining for joining metal films formed on the upper surface of the substrate 2 and the lower surface of the lid 5. In this embodiment, the substrate 2 and the lid 5 are joined via glass frit 59 formed by low-melting point glass.

The sensor element 3 is formed by patterning, with a Bosch process, which is a deep groove etching technique, a conductive silicon substrate doped with impurities such as phosphorus (P), boron (B), or arsenic (As). The sensor element 3 includes, as shown in FIG. 1, a fixed section 31 joined to the upper surface of the mount 22, a movable body 32 swingable around, with respect to the fixed section 31, a swing axis J extending along the Y axis, and a beam 33 configured to couple the fixed section 31 and the movable section 32. The mount 22 and the fixed section 31 are, for example, anodically joined.

The movable body 32 is formed in a rectangular shape longitudinal in the X-direction in the plan view from the Z-axis direction. The movable body 32 includes a first movable section 321 and a second movable section 322 disposed across the swing axis J in the plan view from the Z-axis direction. The first movable section 321 is located on an X-axis direction plus side with respect to the swing axis J. The second movable section 322 is located on an X-axis direction minus side with respect to the swing axis J. The first movable section 321 is longer in the X-axis direction than the second movable section 322. A rotational moment of the first movable section 321 around the swing axis J at the time when the acceleration Az is applied thereto is larger than the rotational moment of the second movable section 322. According to a difference between the rotational moments, the movable body 32 swings in a seesaw manner around the swing axis J when the acceleration Az is applied thereto. The seesaw swinging means that, when the first movable section 321 is displaced to a Z-axis direction plus side, the second movable section 322 is displaced to a Z-axis direction minus side and, conversely, when the first movable section 321 is displaced to the Z-axis direction minus side, the second movable section 322 is displaced to the Z-axis direction plus side.

As shown in FIG. 1, the movable body 32 includes a plurality of through-holes 325 piercing through the movable body 32 in the thickness direction. Since the through-holes 325 are provided, viscous resistance of the movable body 32 decreases. It is possible to more smoothly swing the movable body 32 in a seesaw manner. The movable body 32 includes a through-hole 324 located between the first movable section 321 and the second movable section 322. The fixed section 31 and the beam 33 are disposed in the through-hole 324. It is possible to achieve a reduction in the size of the sensor element 3 by disposing the fixed section 31 and the beam 33 on the inner side of the movable body 32 in this way. However, the through-holes 325 may be omitted. The disposition of the fixed section 31 and the beam 33 is not particularly limited. For example, the fixed section 31 and the beam 33 may be located on the outer side of the movable body 32.

The beam 33 extends along the Y-axis direction. The beam 33 is torsionally deformed around the center axis thereof to thereby allow swinging of the movable body 32 around the swing axis J.

The electrodes 8 are explained again. As shown in FIGS. 1 and 2, the first fixed detection electrode 81 is disposed to be opposed to the proximal end portion of the first movable section 321, the second fixed detection electrode 82 is disposed to be opposed to the second movable section 322, and the dummy electrode 83 is disposed to be opposed to the distal end portion of the first movable section 321. In other words, in the plan view from the Z-axis direction, the first fixed detection electrode 81 is disposed to overlap the proximal end portion of the first movable section 321, the second fixed detection electrode 82 is disposed to overlap the second movable section 322, and the dummy electrode 83 is disposed to overlap the distal end portion of the first movable section 321.

During driving of the inertial sensor 1, a driving voltage is applied to the sensor element 3 via the wire 75. The first fixed detection electrode 81 is coupled to a QV amplifier via the wire 76. The second fixed detection electrode 82 is coupled to another QV amplifier via the wire 77. Consequently, capacitance Ca is formed between the first movable section 321 and the first fixed detection electrode 81. Capacitance Cb is formed between the second movable section 322 and the second fixed detection electrode 82.

As shown in FIG. 2, when the acceleration Az is applied to the inertial sensor 1, the movable body 32 swings in a seesaw manner around the swing axis J. According to this seesaw swinging of the movable body 32, a gap between the first movable section 321 and the first fixed detection electrode 81 and a gap between the second movable section 322 and the second fixed detection electrode 82 change in opposite phases each other. The capacitances Ca and Cb change in opposite phases each other according to the change of the gaps. Therefore, the inertial sensor 1 can detect the acceleration Az based on the change in the capacitances Ca and Cb.

The stopper 4 has a function of suppressing unnecessary displacement other than the seesaw swinging, which is detected vibration, of the movable body 32 around the swing axis J explained above, in particular, rotational displacement around the Z axis centering on the fixed section 31. As shown in FIG. 1, the stopper 4 is formed in a frame shape surrounding the periphery of the sensor element 3 and is joined to the upper surface of the substrate 2. In the stopper 4 having such a configuration, when the movable body 32 is rotationally displaced in a forward direction around the Z axis, the outer circumferential surface of the movable body 32 comes into contact with the inner circumferential surface of the stopper 4. Consequently, further unnecessary displacement of the movable body 32 is suppressed. The disposition and the shape of the stopper 4 are not particularly limited as long as the stopper 4 can exert the function thereof.

Such a stopper 4 is formed by patterning, with a Bosch process, which is a deep groove etching technique, a conductive silicon substrate doped with impurities such as phosphorus (P), boron (B), or arsenic (As). In particular, in this embodiment, the sensor element 3 and the stopper 4 are collectively formed from the same silicon substrate by the Bosch process. Consequently, it is easy to form the structure 6.

Like the sensor element 3, the stopper 4 is electrically coupled to the wire 75. Therefore, the stopper 4 and the sensor element 3 have the same potential. It is substantially unlikely that parasitic capacitance and electrostatic attraction occur between the stopper 4 and the sensor element 3. Therefore, it is possible to effectively suppress deterioration in a detection characteristic of the acceleration Az due to the stopper 4. However, not only this, but the stopper 4 does not have to have the same potential as the potential of the sensor element 3. For example, the stopper 4 may have the ground potential or may be electrically floating.

The configuration of the inertial sensor 1 is briefly explained above. As explained above, the sensor element 3 and the stopper 4 configuring the structure 6 are collectively formed by patterning the conductive silicon substrate with the Bosch process. Therefore, the Bosch process is briefly explained.

Figure 3:
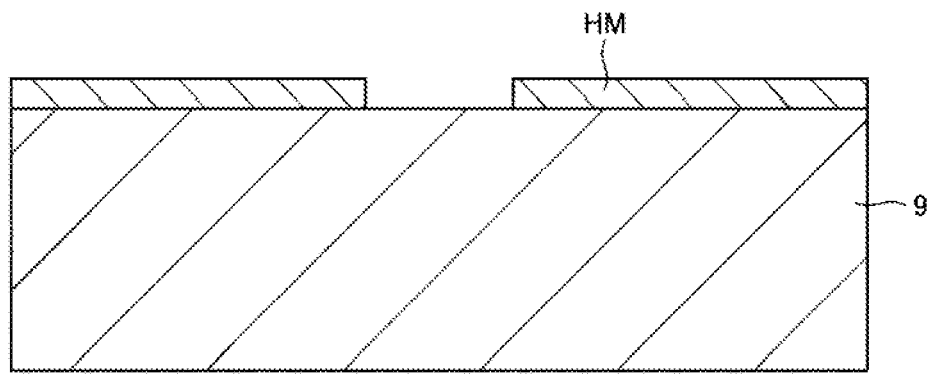
FIG. 3 is a sectional view for explaining a Bosch process.
Figure 4:
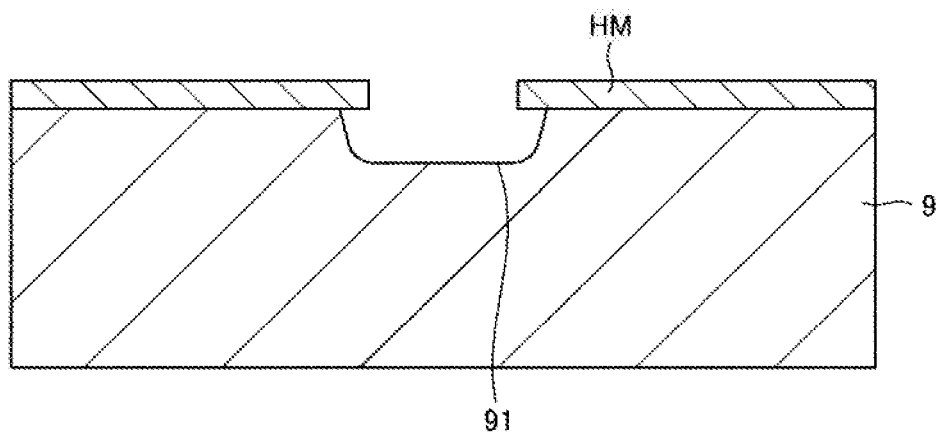
FIG. 4 is a sectional view for explaining the Bosch process.

First, as shown in FIG. 3, a hard mask HM formed by a silicon oxide film ($SiO_2$ film) is formed on the upper surface of a silicon substrate 9. The hard mask HM is patterned. The patterning of the hard mask HM can be realized by, for example, forming a not-shown mask with photoresist on the hard mask HM, etching the hard mask HM using this mask as a mask, and finally removing the photoresist. Subsequently, as shown in FIG. 4, the silicon substrate 9 is isotropically etched using $SF_6$, which is an etching gas, to form a first recess 91.

Figure 5:
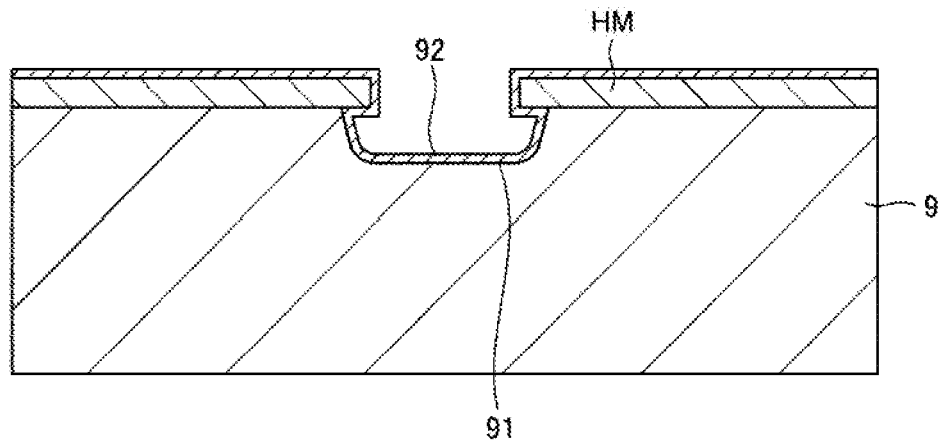
FIG. 5 is a sectional view for explaining the Bosch process.

Subsequently, as shown in FIG. 5, a protection film 92 is formed on the inner surface of the recess 91 using $C_4F_8$, which is a gas for sidewall protection film formation. Subsequently, as shown in FIG. 6, the protection film 92 present in the bottom of the first recess 91 is removed and a second recess 91 opened on the bottom surface of the first recess 91 is formed using $SF_6$, which is the etching gas. Thereafter, by repeating the steps shown in FIGS. 5 and 6, as shown in FIG. 7, a hole 90 having a high aspect ratio in which a plurality of recesses 91 are linked can be formed. Regular unevenness is formed on the inner circumferential surface of the hole 90 by the linking of the plurality of recesses 91. The unevenness is called "scallops SC".

The structure 6 is explained again. A plurality of holes are formed in the structure 6 by the Bosch process. Specifically, as shown in FIG. 8, the structure 6 includes first holes 61 forming the through-holes 325, a second hole 62 located between the sensor element 3 and the stopper 4 and separating the sensor element 3 and the stopper 4, and third holes 63 forming the through-hole 324. The first, second, and third holes 61, 62, and 63 are respectively through-holes piercing through a silicon substrate 60 in the Z-axis direction. As it is seen from the figures, the first, second, and third holes 61, 62, and 63 respectively have different widths. When the width of an opening of the first hole 61 is represented as a first width W1, the width of an opening of the second hole 62 is represented as a second width W2, and the width of an opening of the third hole 63 is represented as a third width W3, these widths satisfy W2<W3<W1.

Since W2<W3 is satisfied, when the movable body 32 is unnecessarily rotationally displaced around the Z axis, it is possible to, before the movable body 32 and the beam 33 come into contact with the fixed section 31, bring the movable body into contact with the stopper 4 and prevent further rotational displacement. Therefore, the stopper 4 can surely exert the function of the stopper 4 and breakage of the beam 33 and the fixed section 31 can be suppressed. Since W3<W1 is satisfied, the through-holes 325 are sufficiently large. Accordingly, viscous resistance during the seesaw swinging of the movable body 32 decreases. It is possible to more smoothly swing the movable body 32 in a seesaw manner.

As shown in FIG. 9, when the number of the scallops SC formed on the sidewall of the first hole 61 is represented as N1, the number of the scallops SC formed on the sidewall of the second hole 62 is represented as N2, and the number of the scallops SC formed on the sidewall of the third hole 63 is represented as N3, the numbers of the scallops SC satisfy N1<N3<N2. In other words, when the height, which is the length in the Z-axis direction, of the scallops SC of the first hole 61 is represented as L1, the height of the scallops SC of the second hole 62 is represented as L2, and the height of the scallops SC of the third hole 63 is represented as L3, the heights satisfy L2<L3<L1. That is, in a hole having smaller width, the number of the scallops SC is larger and the height of the scallops SC is smaller.

As the number of the scallops SC formed on the sidewall of a hole is larger, unevenness of the sidewall of the hole decreases and chips and cracks during contact less easily occur. Further, dimension accuracy of width increases because erosion in the width direction by the isotropic etching is small. Therefore, by configuring the outer circumferential surface of the movable body 32 and the inner circumferential surface of the stopper 4 that come into contact with each other when unnecessary rotational displacement occurs and setting the number N2 of the scallops SC of the second hole 62 forming a gap between the movable body 32 and the stopper 4 larger than the numbers N1 and N3 of the scallops SC of the other first and third holes 61 and 63, the inertial sensor 1 having high mechanical strength and excellent in gap management between the movable body 32 and the stopper 4 is obtained.

As explained above, the inertial sensor 1 functioning as the device includes the substrate 2 and the structure 6 provided on the substrate 2 and including the first holes 61 having the first width W1 and the second hole 62 having the second width W2 smaller than the first width W1. The first holes 61 and the second hole 62 are respectively etching holes formed by dry etching. The height L1 of the scallops SC on the sidewalls of the first holes 61 is larger than the height L2 of the scallops SC on the sidewall of the second hole 62. By adopting such a configuration, hole dimensions of the first and second holes 61 and 62 are equalized. In particular, a rate of change in the Z-axis direction of the first and second widths W1 and W2 can be reduced. It is possible to obtain the inertial sensor 1 having high mechanical strength and excellent in gap management between the movable body 32 and the stopper 4.

A method of forming the structure 6 is explained in a method of manufacturing the inertial sensor 1 explained below. The method of manufacturing the inertial sensor 1 includes, as shown in FIG. 10, a silicon substrate joining step for joining the silicon substrate 60 to the substrate 2, a structure forming step for patterning the silicon substrate 60 with the Bosch process to form the sensor element 3 and the stopper 4, and a lid joining step for joining the lid 5 to the substrate 2.

Silicon Substrate Joining Step

Figure 11:
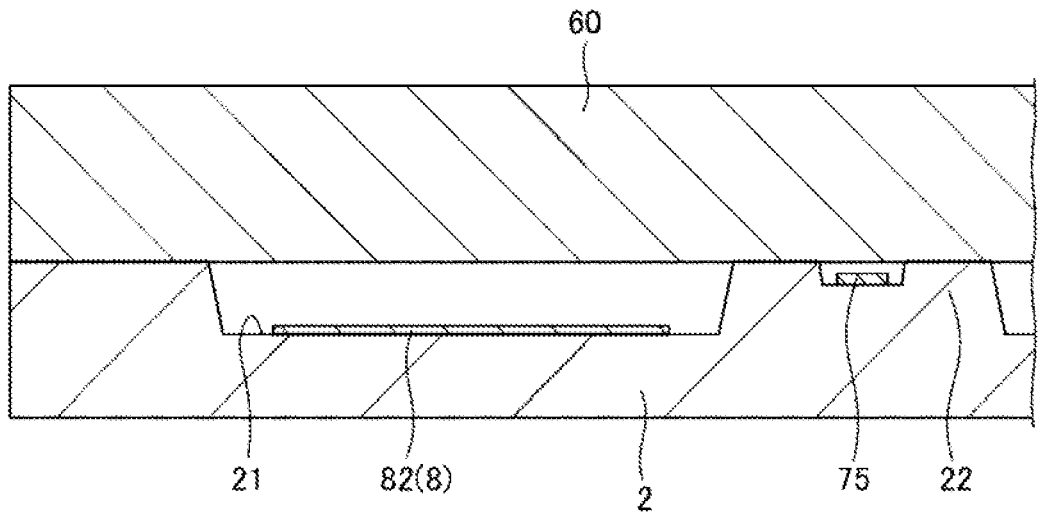
FIG. 11 is a sectional view for explaining a manufacturing method for the inertial sensor.

First, the substrate 2 on which the electrodes 8 and the wires 75, 76, and 77 are disposed is prepared. Subsequently, as shown in FIG. 11, the silicon substrate 60, which is a base material of the structure 6, is prepared. The silicon substrate 60 is anodically joined to the upper surface of the substrate 2. Impurities are already doped in and electric conductivity is already imparted to the silicon substrate 60. Subsequently, according to necessity, the silicon substrate 60 is thinned to a desired thickness by CMP (chemical mechanical polishing) or the like.

Structure Forming Step

Figure 12:
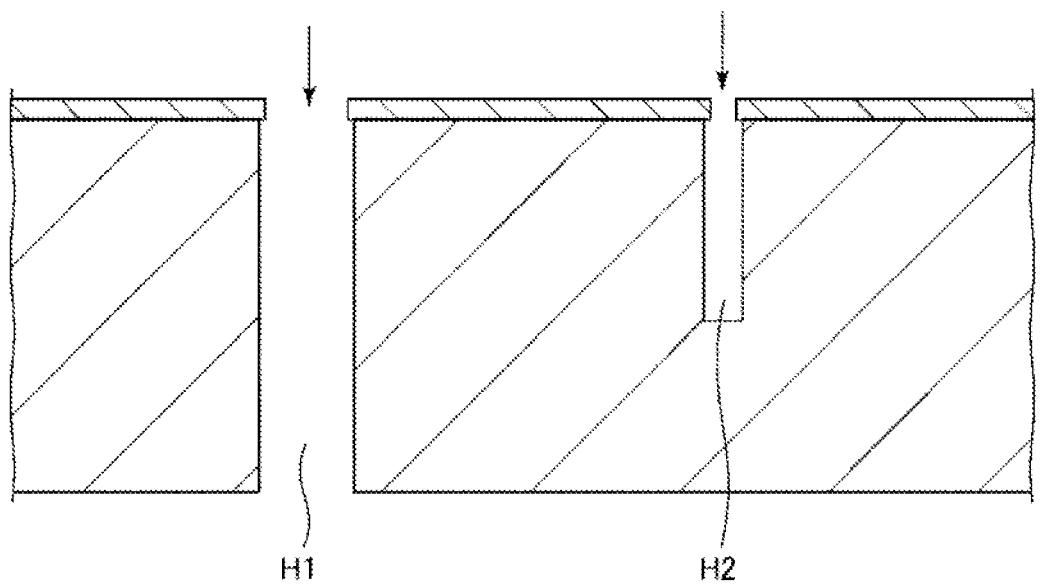
FIG. 12 is a sectional view for explaining the manufacturing method for the inertial sensor.

Before explanation of this step, the Bosch process is explained again. According to a micro loading effect, etching speed is lower as the width of a hole to be formed is smaller. That is, as shown in FIG. 12, when etching of a plurality of holes H1 and H2 having different widths is simultaneously started, the hole H1 having larger width is formed first and the hole H2 having smaller width is formed later.

If formation times of the plurality of holes H1 and H2 deviate because of such a difference in the etching speed, the following problem occurs. For example, when an etching time is set based on the hole H1 etched at high etching speed, the hole H2 etched at low etching speed cannot be formed. Conversely, when the etching time is set based on the hole H2 etched at the low etching speed, the hole H1 is over-etched from the formation of the hole H1 until the formation of the hole H2. The hole H1 is deformed and a member located right under the hole H1 is continuously damaged by the etching.

Therefore, in this embodiment, etching start time of the hole H1 is set later than etching start time of the hole H2 such that the holes H1 and H2 are formed at the same time as much as possible. This is explained more in detail with reference to the structure 6 as an example.

Figure 13:
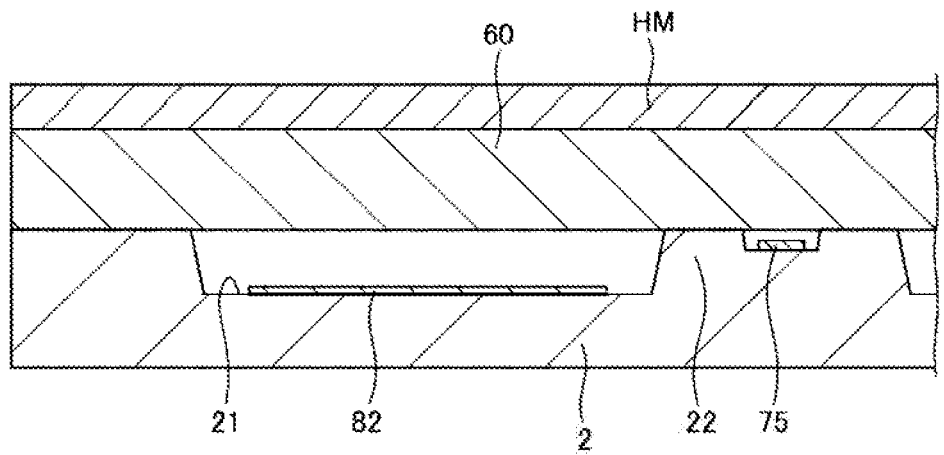
FIG. 13 is a sectional view for explaining the manufacturing method for the inertial sensor.

First, as shown in FIG. 13, the hard mask HM configured by a silicon oxide film is formed on the upper surface of the silicon substrate 60. A method of forming the hard mask HM is not particularly limited. For example, the hard mask HM can be formed by plasma CVD using TEOS (tetraethoxysilane).

Figure 14:
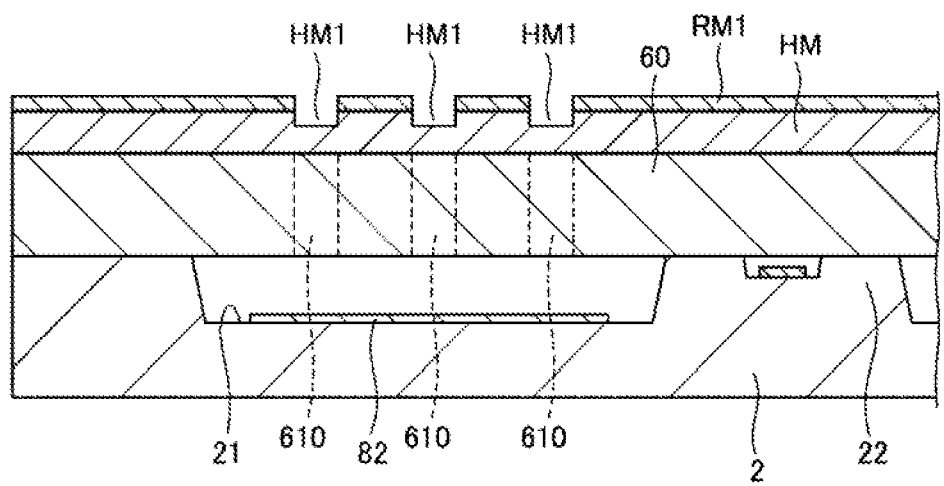
FIG. 14 is a sectional view for explaining the manufacturing method for the inertial sensor.

Subsequently, as shown in FIG. 14, a resist mask RM1 including openings corresponding to first hole forming regions 610 where the first holes 61 are formed is formed on the hard mask HM. The hard mask HM is half-etched using the resist mask RM1 as a mask to form bottomed recesses HM1.

Figure 15:
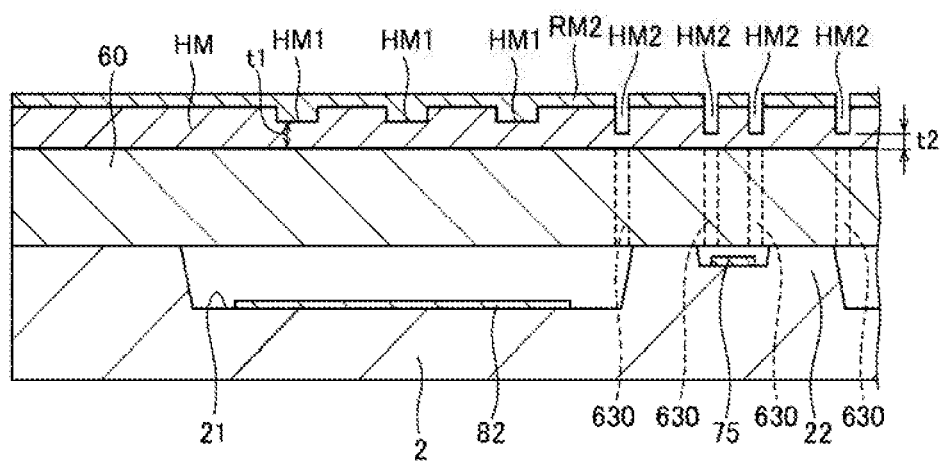
FIG. 15 is a sectional view for explaining the manufacturing method for the inertial sensor.

Subsequently, after the resist mask RM1 is removed, as shown in FIG. 15, a resist mask RM2 including openings corresponding to third hole forming regions 630 where the third holes 63 are formed is formed on the hard mask HM. The hard mask HM is half-etched using the resist mask RM2 as a mask to form bottomed recesses HM2 deeper than the recesses HM1. That is, thickness t1 of portions of the hard mask HM where the recesses HM1 are formed is larger than thickness t2 of portions where the recesses HM2 are formed.

Figure 16:
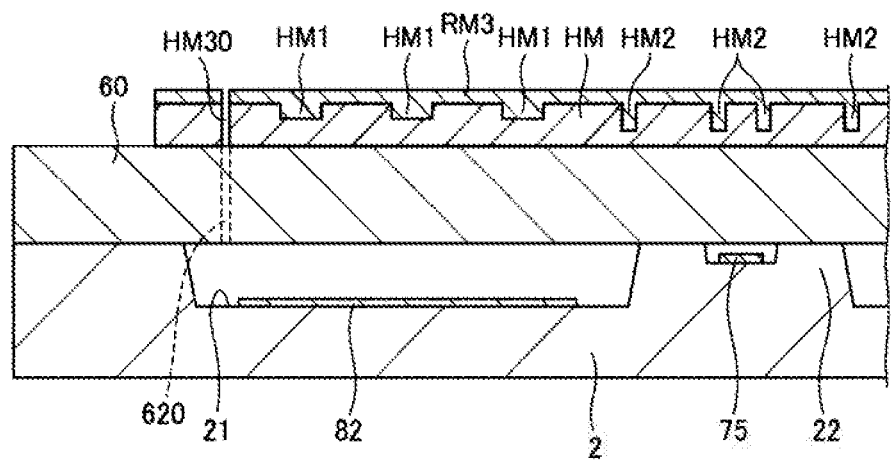
FIG. 16 is a sectional view for explaining the manufacturing method for the inertial sensor.

Subsequently, after the resist mask RM2 is removed, as shown in FIG. 16, a resist mask RM3 including an opening corresponding to a second hole forming region 620 where the second hole 62 is formed is formed on the hard mask HM. The hard mask HM is etched using the resist mask RM3 as a mask to form a through-hole HM30. Formation order of the recesses HM1 and HM2 and the through-hole HM30 is not particularly limited.

Figure 17:
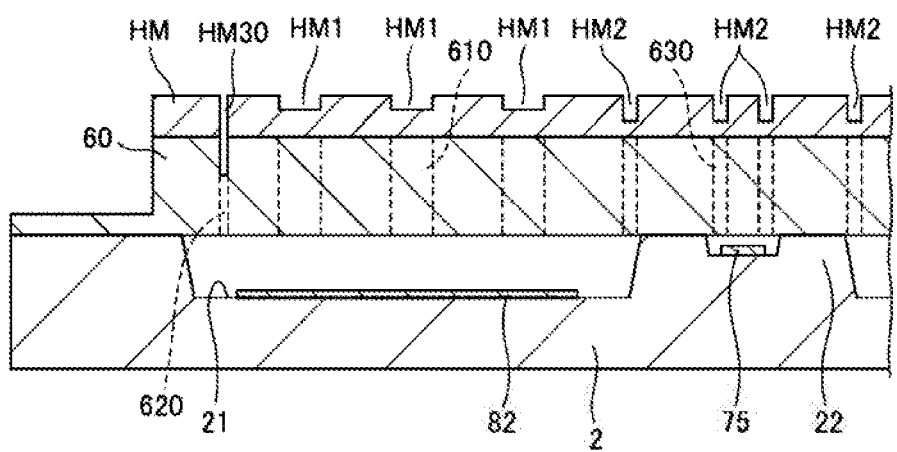
FIG. 17 is a sectional view for explaining the manufacturing method for the inertial sensor.
Figure 18:
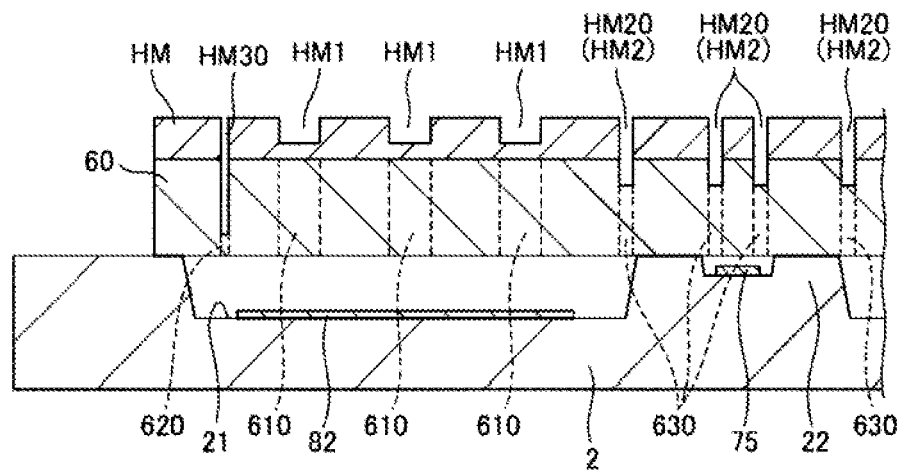
FIG. 18 is a sectional view for explaining the manufacturing method for the inertial sensor.
Figure 19:
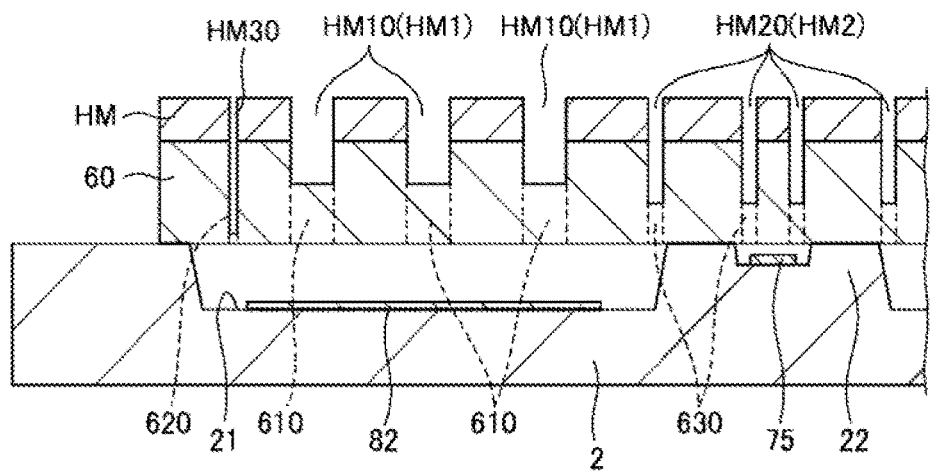
FIG. 19 is a sectional view for explaining the manufacturing method for the inertial sensor.

Subsequently, after the resist mask RM3 is removed, the silicon substrate 60 is dry-etched by the Bosch process using the hard mask HM as a mask. Then, as shown in FIGS. 17 to 19, first, etching of the second hole forming region 620 is started. Subsequently, when the bottoms of the recesses HM2 are removed and through-holes HM20 are formed, etching of the third hole forming regions 630 is started. Subsequently, when the bottoms of the recesses HM1 are removed and through-holes HM10 are formed, etching of the first hole forming regions 610 is started.

Figure 20:
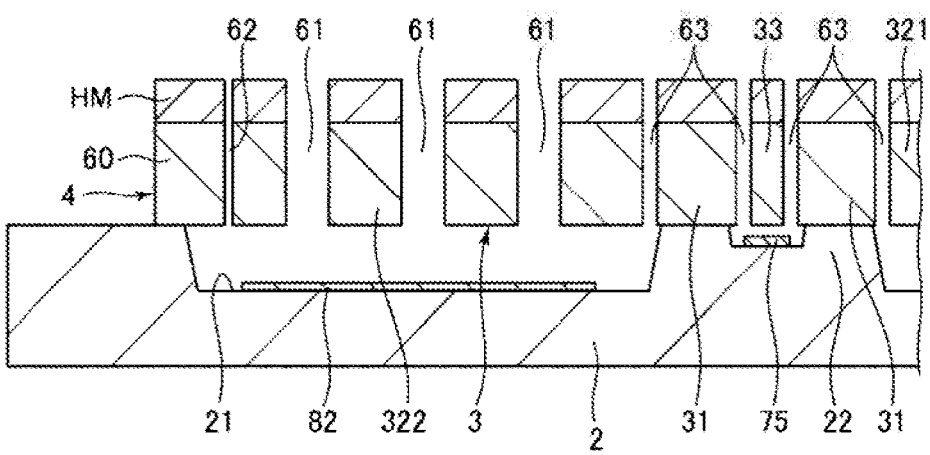
FIG. 20 is a sectional view for explaining the manufacturing method for the inertial sensor.

In other words, start time of etching shifts in the order of the second hole forming region 620 where etching speed is the lowest, the third hole forming regions 630 where the etching speed is the second lowest, and the first hole forming regions 610 where the etching speed is the highest. By shifting the start time of the etching according to the differences in the etching speed, as shown in FIG. 20, the etchings of the first to third hole forming regions 610 to 630 end substantially simultaneously and the first to third holes 61 to 63 are substantially simultaneously formed. Therefore, it is possible to reduce, preferably, eliminate deviation of formation completion times of the first to third holes 61 to 63.

Therefore, it is possible to prevent a situation in which a hole formed earlier is over-etched to cause shape deviation and a member present right under the hole is damaged by the etching. It is possible to manufacture the inertial sensor 1 having high dimension accuracy and having small damage. For example, in the case of this embodiment, when etching start times of the first, second, and third holes 61, 62, and 63 are set to the same time, the first holes 61 are formed first and the third holes 63 are formed next. It is likely that the first holes 61 and the third holes 63 are over-etched until the second hole 62 is formed, shape deviation of the first holes 61 and the third holes 63 occurs, the electrodes 8 located right under the first and third holes 61 and 63 are damaged by the etching, and a part of the electrodes 8 is removed and the capacitances Ca and Cb change.

According to the steps explained above, the sensor element 3 and the stopper 4 are collectively formed from the silicon substrate 60 and the structure 6 is obtained.

Lid Joining Step

Figure 21:
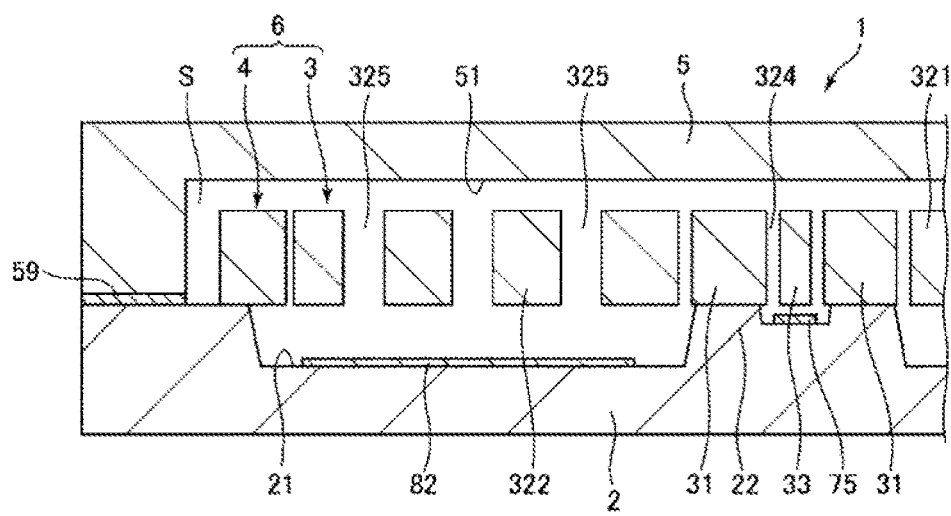
FIG. 21 is a sectional view for explaining the manufacturing method for the inertial sensor.

Subsequently, as shown in FIG. 21, the lid 5 is joined to the upper surface of the substrate 2 via the glass frit 59. Consequently, the inertial sensor 1 is obtained.

The method of manufacturing the inertial sensor 1, in particular, the method of forming the structure 6 is explained above. Such a method of forming the structure 6 is a structure forming method for forming the first holes 61 and the second hole 62 smaller than the first holes 61 in the silicon substrate 60, which is a substrate, by dry etching to form the structure 6, the structure forming method including a step of forming the hard mask HM functioning as an etching mask on the silicon substrate 60, a step of etching portions of the hard mask HM overlapping, in the Z-axis direction, the first hole forming regions 610 where the first holes 61 are formed, a step of etching a portion of the hard mask HM overlapping, in the Z-axis direction, the second hole forming region 620 where the second hole 62 is formed, and a step of dry-etching the silicon substrate 60 using the hard mask HM as a mask. With such a forming method, since the portions of the hard mask HM overlapping the first hole forming regions 610 and the portion of the hard mask HM overlapping the second hole forming region 620 can be respectively separately machined, it is easy to adjust deviation of the etching start times of the first and second holes 61 and 62. Therefore, it is possible to reduce deviation of formation completion times of the first holes 61 and the second hole 62. Over-etching of the first holes 61 is suppressed. It is possible to effectively suppress shape deviation and the like of the first holes 61. Therefore, the structure 6 with high dimension accuracy is obtained.

As explained above, in the step of etching the portions of the hard mask HM overlapping the first hole forming regions 610, the bottomed recesses HM1 are formed in the hard mask HM. In the step of etching the portion in the hard mask HM overlapping the second hole forming region 620, the through-hole HM30 is formed in the hard mask HM. By adopting such a configuration, it is possible to delay the etching start time of the first hole forming regions 610 from the etching start time of the second hole forming region 620.

As explained above, the structure 6 includes the electrodes 8 (the first fixed detection electrode 81, the second fixed detection electrode 82, and the dummy electrode 83) disposed to overlap the first holes 61 in the plan view of the silicon substrate 60. With the method of forming the structure 6 explained above, since the over-etching of the first holes 61 is suppressed, even if the electrodes 8 are located right under the first holes 61, it is possible to reduce etching damage to the electrodes 8.

The inertial sensor 1 is explained above. However, the configuration of the inertial sensor 1 is not limited to this embodiment. For example, although the structure 6 in this embodiment includes the sensor element 3 and the stopper 4, the stopper 4 may be deleted. In this case, the second hole 62 is omitted from this embodiment. Instead, the third holes 63 can be explained as "second holes". The sensor element 3 may detect acceleration in the X-axis direction, may detect acceleration in the Y-axis direction, may detect angular velocity around the X axis, may detect angular velocity around the Y axis, or may detect angular velocity around the Z axis. Not all of the first holes 61 and the electrodes 8 need to be disposed to overlap in the plan view of the silicon substrate 60.

Second Embodiment

Figure 22:
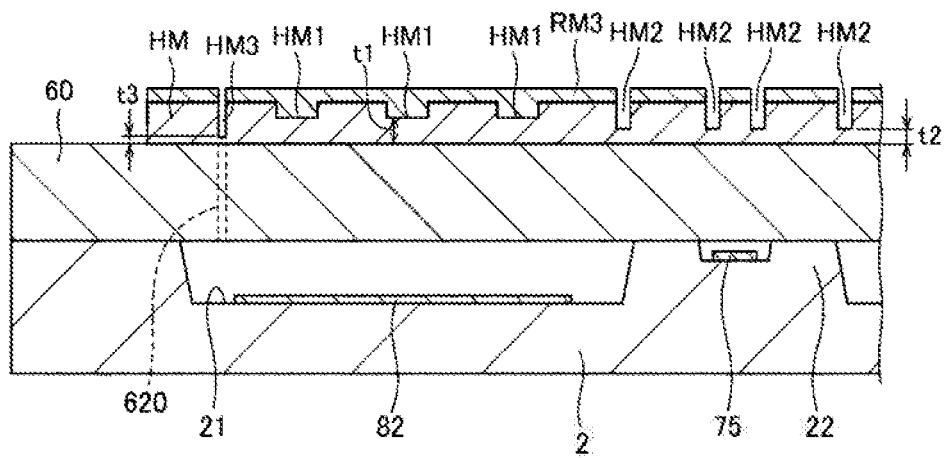
FIG. 22 is a sectional view for explaining a structure forming method according to a second embodiment.

FIG. 22 is a sectional view for explaining a structure forming method according to a second embodiment.

This embodiment is the same as the first embodiment explained above except that the configuration of the hard mask HM is different. In the following explanation, concerning this embodiment, differences from the embodiment explained above are mainly explained. Explanation of similarities is omitted. In FIG. 22, the same components as the components in the embodiment explained above are denoted by the same reference numerals and signs.

In this embodiment, first, as in the first embodiment explained above, the hard mask HM configured by the silicon oxide film is formed on the upper surface of the silicon substrate 60. Subsequently, the recesses HM1 and HM2 are formed in the hard mask HM. Subsequently, after the resist mask RM2 is removed, as shown in FIG. 22, the resist mask RM3 including the opening corresponding to the second hole forming region 620 is formed on the hard mask HM. The hard mask HM is etched using the resist mask RM3 as a mask to form a bottomed recess HM3 deeper than the recesses HM1 and HM2. That is, thickness t3 of a portion of the hard mask HM where the recess HM3 is formed is smaller than the thicknesses t1 and t2 of the portions where the recesses HM1 and HM2 are formed.

When the silicon substrate 60 is dry-etched by the Bosch process using such a hard mask HM as a mask, as in the first embodiment explained above, it is possible to shift the etching start times of the first, second, and third hole forming regions 610, 620, and 630. Therefore, the etchings of the first, second, and third hole forming regions 610, 620, and 630 substantially simultaneously end. The first, second, and third holes 61, 62, and 63 are substantially simultaneously formed. Therefore, it is possible to reduce, preferably, eliminate deviation of formation completion times of the first, second, and third holes 61, 62, and 63.

In this way, in the method of manufacturing the structure 6 in this embodiment, in the step of etching the portions of the hard mask HM overlapping the first hole forming regions 610, the bottomed recesses HM1 are formed in the hard mask HM. In the step of etching the portion of the hard mask HM overlapping the second hole forming region 620, the bottomed recess HM3 is formed in the hard mask HM. The thickness t1 of the portions of the hard mask HM where the recesses HM1 functioning as first recesses are provided is larger than the thickness t3 of the portion where the recess HM3 functioning as a second recess is provided. By adopting such a configuration, the etching start time of the first hole forming regions 610 can be set later than the etching start time of the second hole forming region 620.

According to such a second embodiment, it is possible to exert the same effects as the effects in the first embodiment explained above.

Third Embodiment

Figure 23:
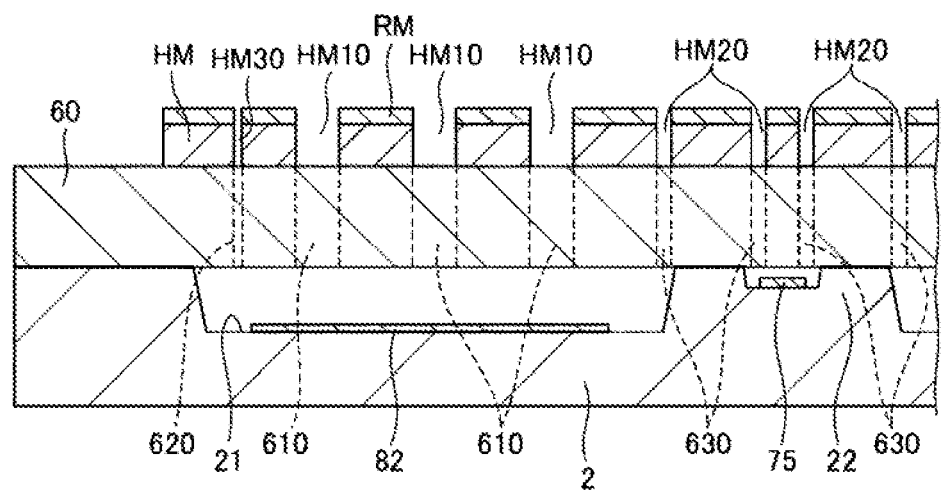
FIG. 23 is a sectional view for explaining a structure forming method according to a third embodiment.
Figure 24:
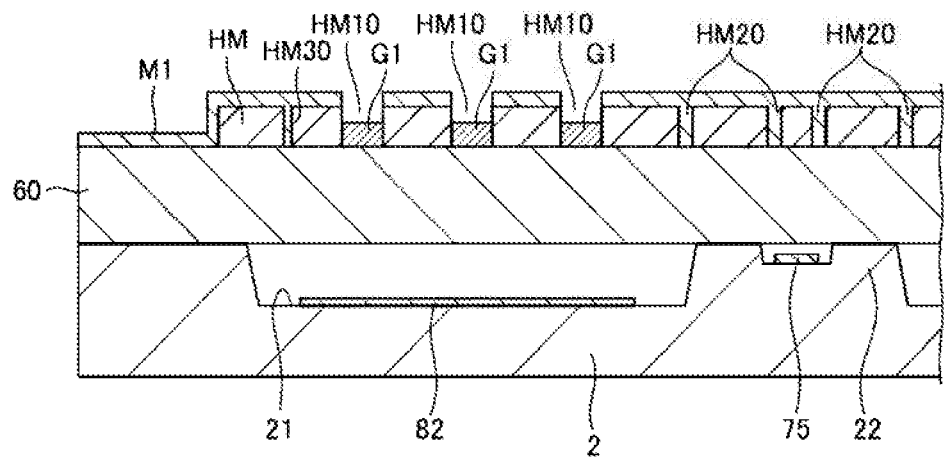
FIG. 24 is a sectional view for explaining the structure forming method according to the third embodiment.
Figure 25:
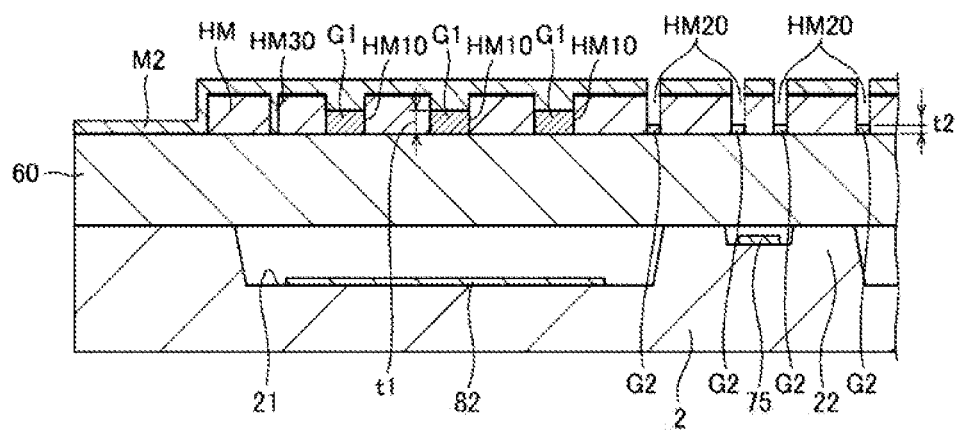
FIG. 25 is a sectional view for explaining the structure forming method according to the third embodiment.

FIGS. 23 to 25 are respectively sectional views for explaining a structure forming method according to a third embodiment.

This embodiment is the same as the first embodiment explained above except that the configuration of the hard mask HM is different. In the following explanation, concerning this embodiment, differences from the embodiments explained above are mainly explained. Explanation of similarities is omitted. In FIGS. 23 to 25, the same components as the components in the embodiments explained above are denoted by the same reference numerals and signs.

In this embodiment, first, the hard mask HM configured by the silicon oxide film is formed on the upper surface of the silicon substrate 60. Subsequently, as shown in FIG. 23, the resist mask RM including the openings corresponding to the first, second, and third hole forming regions 610, 620, and 630 is formed on the hard mask HM. The hard mask HM is etched using the resist mask RM as a mask to form the through-holes HM10, HM20, and HM30 in the hard mask HM.

Subsequently, as shown in FIG. 24, a mask M1 covering a portion other than the through-holes HM10 is formed on the hard mask HM. A filler G1 is filled in the through-holes HM10 to bury a part of the through-holes HM10. Subsequently, after the mask M1 is removed, as shown in FIG. 25, a mask M2 covering a portion other than the through-holes HM20 is formed on the hard mask HM. A filler G2 is filled in the through-holes HM20 to bury a part of the through-holes HM20.

With such a configuration, by selecting thicknesses t1 and t2, a constituent material, and the like of the fillers G1 and G2 as appropriate, it is possible to respectively highly accurately control time when the filler G1 is removed and etching of the first hole forming regions 610 is started and time when the filler G2 is removed and etching of the third hole forming regions 630 is started. It is easier to control the thicknesses t1 and t2 when the through-holes HM10 and HM20 are formed once and, thereafter, a part of the through-holes HM10 and HM20 is reburied than when the recesses HM1 and HM2 are formed by the half-etching in the first embodiment explained above. It is possible to more accurately control the etching start times of the first hole forming regions 610 and the third hole forming regions 630.

A method of filling the fillers G1 and G2 is not particularly limited. For example, plasma CVD can be used. The constituent material of the fillers G1 and G2 is not particularly limited. Examples of the constituent material include various resin materials, various metal materials, and silicon compounds such as silicon oxide and silicon nitride. The constituent material of the fillers G1 and G2 may be the same material as the constituent material of the hard mask HM or may be a material different from the constituent material of the hard mask HM. However, the constituent material of the fillers G1 and G2 is desirably the material different from the constituent material of the hard mask HM. Consequently, choices of the material increase and more suitable fillers G1 and G2 can be used. Therefore, it is possible to more accurately control the etching start times of the first hole forming regions 610 and the third hole forming regions 630. The fillers G1 and G2 may be formed of the same constituent material or may be formed of different constituent materials.

When the silicon substrate 60 is dry-etched by the Bosch process using such a hard mask HM as a mask, as in the first embodiment explained above, it is possible to shift the etching start times of the first to third hole forming regions 610 to 630. Therefore, the etchings of the first to third hole forming regions 610 to 630 substantially simultaneously end. The first to third holes 61 to 63 are substantially simultaneously formed. Therefore, it is possible to reduce, preferably, eliminate deviation of formation completion times of the first to third holes 61 to 63.

In this way, in the method of manufacturing the structure 6 in this embodiment, in the step of etching the portions of the hard mask HM overlapping the first hole forming regions 610, after the through-holes HM10 are formed in the hard mask HM, the filler G1 is filled in the through-holes HM10. In the step of etching the portion of the hard mask HM overlapping the second hole forming region 620, the through-hole HM30 is formed in the hard mask HM. By adopting such a configuration, the etching start time of the first hole forming regions 610 can be set later than the etching start time of the second hole forming region 620.

As explained above, the constituent material of the filler G1 is different from the constituent material of the hard mask HM. Consequently, choices of the material increase and more suitable filler G1 can be used. Therefore, it is possible to more accurately control the etching start time of the first hole forming regions 610.

According to such a third embodiment, it is possible to exert the same effects as the effects in the first embodiment explained above.

Fourth Embodiment

Figure 26:
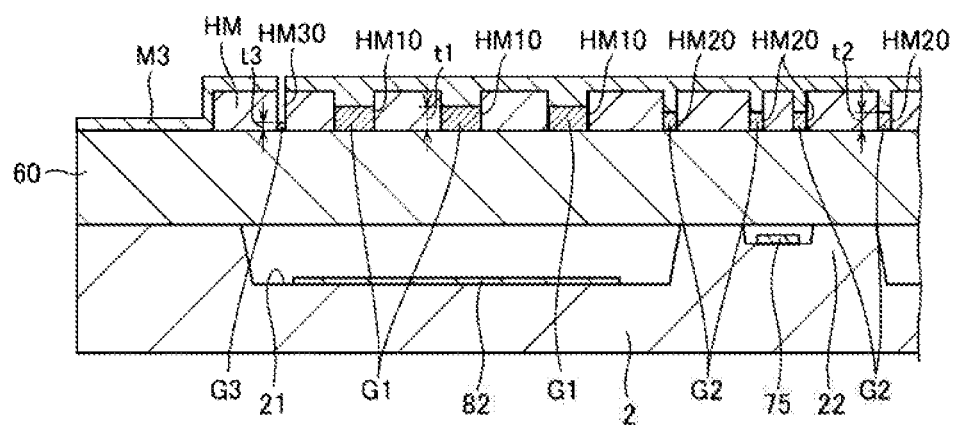
FIG. 26 is a sectional view for explaining a structure forming method according to a fourth embodiment.

FIG. 26 is a sectional view for explaining a structure forming method according to a fourth embodiment.

This embodiment is the same as the first embodiment explained above except that the configuration of the hard mask HM is different. In the following explanation, concerning this embodiment, differences from the embodiments explained above are mainly explained. Explanation of similarities is omitted. In FIG. 26, the same components as the components in the embodiments explained above are denoted by the same reference numerals and signs.

In this embodiment, first, the hard mask HM configured by the silicon oxide film is formed on the upper surface of the silicon substrate 60. Subsequently, as in the third embodiment explained above, the through-holes HM10, HM20, and HM30 are formed in the hard mask HM. Further, the filler G1 is filled in the through-holes HM10 and the filler G2 is filled in the through-holes HM20.

Subsequently, as shown in FIG. 26, a mask M3 covering a portion other than the through-hole HM30 is formed on the hard mask HM. A filler G3 is filled in the through-hole HM30 to bury a part of the through-hole HM30. With such a configuration, by respectively selecting thicknesses t1, t2, and t3 and a constituent material of the fillers G1, G2, and G3 as appropriate, it is possible to respectively highly accurately control time when the filler G1 is removed and etching of the first hole forming regions 610 is started, time when the filler G2 is removed and etching of the third hole forming regions 630 is started, and time when the filler G3 is removed and etching of the second hole forming region 620 is started. A filling method and a constituent material of the filler G3 are the same as those of the fillers G1 and G2 explained above.

According to such a fourth embodiment, it is possible to exert the same effects as the effects in the first embodiment explained above.

Fifth Embodiment

FIGS. 27 to 30 are respectively sectional views for explaining a structure forming method according to a fifth embodiment.

This embodiment is the same as the first embodiment explained above except that the configuration of the hard mask HM is different. In the following explanation, concerning this embodiment, differences from the embodiments explained above are mainly explained. Explanation of similarities is omitted. In FIGS. 27 to 30, the same components as the components in the embodiments explained above are denoted by the same reference numerals and signs.

Figure 27:
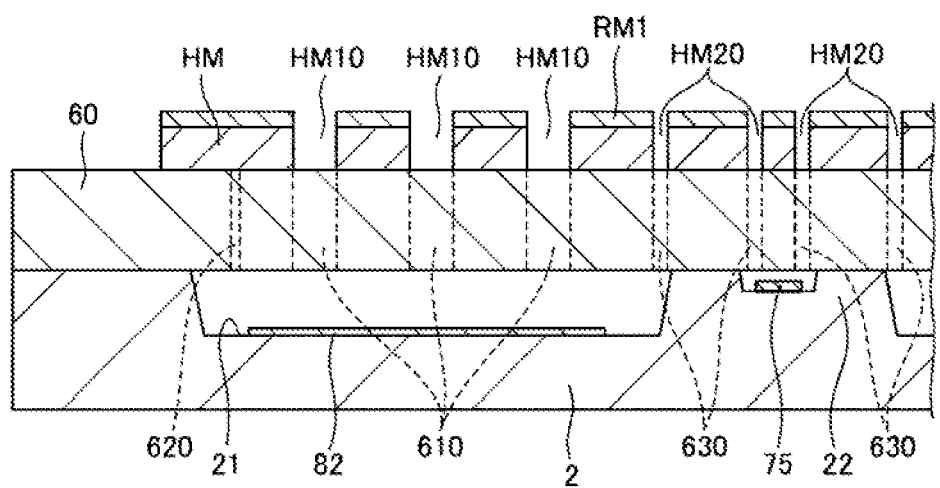
FIG. 27 is a sectional view for explaining a structure forming method according to a fifth embodiment.

In this embodiment, first, the hard mask HM configured by the silicon oxide film is formed on the upper surface of the silicon substrate 60. Subsequently, as shown in FIG. 27, the resist mask RM1 including openings corresponding to the first and third hole forming regions 610 and 630 is formed on the hard mask HM. The hard mask HM is etched using the resist mask RM1 as a mask to form the through-holes HM10 and HM20.

Figure 28:
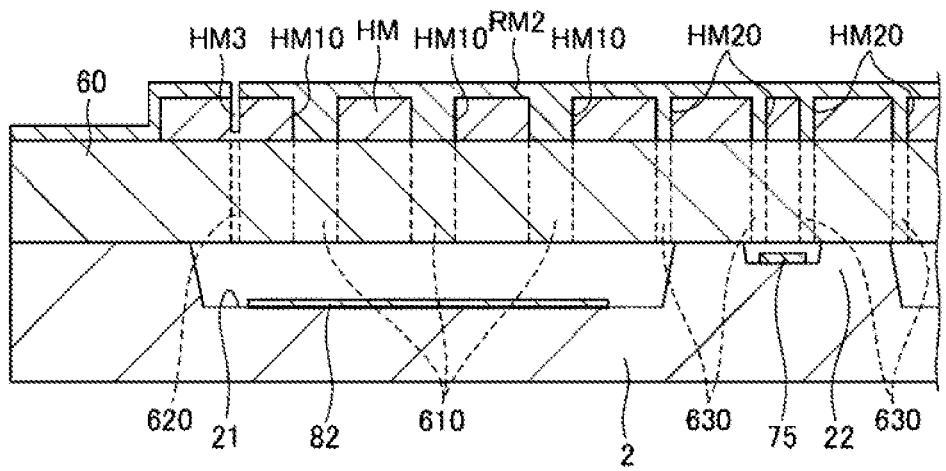
FIG. 28 is a sectional view for explaining the structure forming method according to the fifth embodiment.

Subsequently, after the resist mask RM1 is removed, as shown in FIG. 28, the resist mask RM2 including an opening corresponding to the second hole forming region 620 is formed on the hard mask HM. The hard mask HM is half-etched using the resist mask RM2 as a mask to form the bottomed recess HM3.

Figure 29:
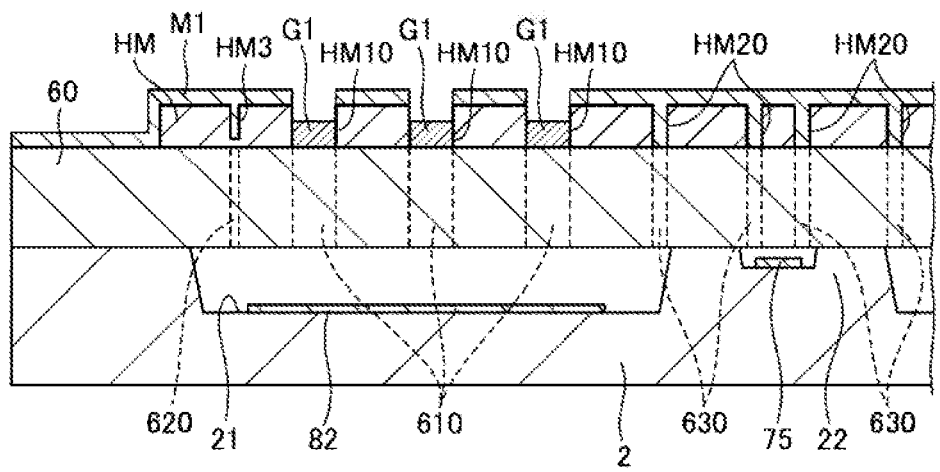
FIG. 29 is a sectional view for explaining the structure forming method according to the fifth embodiment.
Figure 30:
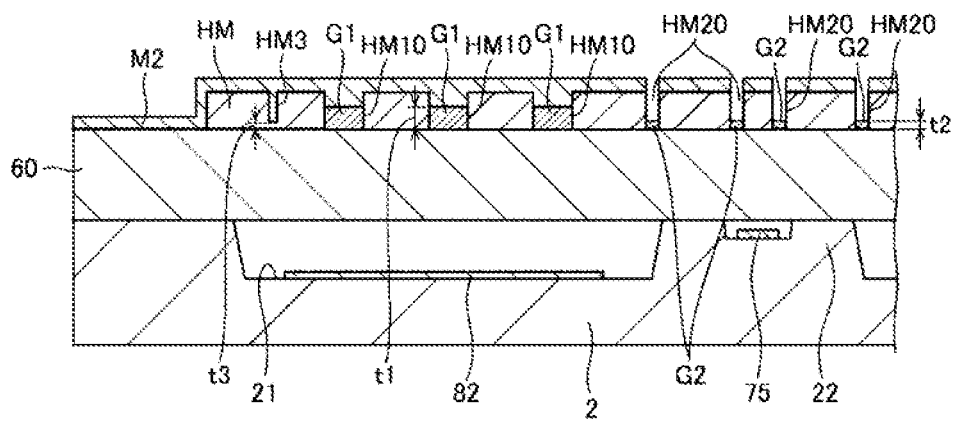
FIG. 30 is a sectional view for explaining the structure forming method according to the fifth embodiment.

Subsequently, after the resist mask RM2 is removed, as shown in FIG. 29, the mask M1 covering a portion other than the through-holes HM10 is formed on the hard mask HM. The filler G1 is filled in the through-holes HM10 to bury a part of the through-holes HM10. Subsequently, after the mask M1 is removed, as shown in FIG. 30, the mask M2 covering a portion other than the through-holes HM20 is formed on the hard mask HM. The filler G2 is filled in the through-holes HM20 to bury a part of the through-holes HM20.

With such a configuration, by selecting the thicknesses t1 and t2, a constituent material, and the like of the fillers G1 and G2 as appropriate, it is possible to respectively highly accurately control time when the filler G1 is removed and etching of the first hole forming regions 610 is started and time when the filler G2 is removed and etching of the third hole forming regions 630 is started. By controlling thickness t3 of a portion of the hard mask HM overlapping the recess HM3, it is possible to highly accurately control time when the hard mask HM is removed and etching of the second hole forming region 620 is started.

When the silicon substrate 60 is dry-etched by the Bosch process using such a hard mask HM as a mask, as in the first embodiment explained above, it is possible to shift the etching start times of the first to third hole forming regions 610 to 630. Therefore, the etchings of the first to third hole forming regions 610 to 630 substantially simultaneously end. The first to third holes 61 to 63 are substantially simultaneously formed. Therefore, it is possible to reduce, preferably, eliminate deviation of formation completion times of the first to third holes 61 to 63.

In this way, in the method of manufacturing the structure 6 in this embodiment, in the step of etching the portions of the hard mask HM overlapping the first hole forming regions 610, after the through-holes HM10 are formed in the hard mask HM, the filler G1 is filled in the through-holes HM10. In the step of etching the portion of the hard mask HM overlapping the second hole forming region 620, the bottomed recess HM3 is formed in the hard mask HM. By adopting such a configuration, it is possible to respectively highly accurately control the etching start time of the first hole forming regions 610 and the etching start time of the second hole forming region 620.

According to such a fifth embodiment, it is possible to exert the same effects as the effects in the first embodiment explained above.

The structure forming method and the device according to the present disclosure are explained above based on the embodiments shown in the figures. However, the present disclosure is not limited to the structure forming method and the device. The components of the sections can be replaced with any components having the same functions. Any other components may be added to the present disclosure. The embodiments explained above may be combined as appropriate.

What is claimed is:

1. A structure forming method for forming a first hole and a second hole having width smaller than width of the first hole in a substrate with dry etching and forming a structure, the structure forming method comprising:
   forming an etching mask on the substrate;
   etching a portion of the etching mask overlapping a first hole forming region where the first hole is formed;
   etching a portion of the etching mask overlapping a second hole forming region where the second hole is formed, and
   performing the dry etching of the substrate using the etching mask as a mask,
   wherein
   in the etching the portion of the etching mask overlapping the first hole forming region, a bottomed first recess is formed in the etching mask,
   in the etching the portion of the etching mask overlapping the second hole forming region, a bottomed second recess is formed in the etching mask, and
   thickness of a portion of the etching mask where the first recess is provided is larger than thickness of a portion of the etching mask where the second recess is provided.

2. The structure forming method according to claim 1, wherein
   in the etching the portion of the etching mask overlapping the first hole forming region, a bottomed recess is formed in the etching mask, and
   in the etching the portion of the etching mask overlapping the second hole forming region, a through-hole is formed in the etching mask.

3. The structure forming method according to claim 1, wherein in the etching the portion of the etching mask overlapping the first hole forming region, after a through-hole is formed in the etching mask, a filler is filled in the through-hole, and in the etching the portion of the etching mask overlapping the second hole forming region, a through-hole is formed in the etching mask.

4. The structure forming method according to claim 3, wherein a constituent material of the filler is different from a constituent material of the etching mask.

5. The structure forming method according to claim 1, wherein in the etching the portion of the etching mask overlapping the first hole forming region, after a through-hole is formed in the etching mask, a filler is filled in the through-hole, and in the etching the portion of the etching mask overlapping the second hole forming region, a bottomed recess is formed in the etching mask.

6. The structure forming method according to claim 1, wherein the structure includes an electrode disposed to overlap the first hole in a plan view of the substrate.

7. A device comprising:

a substrate; and a structure provided on the substrate and including a first hole having first width and a second hole having second width smaller than the first width, wherein the first hole and the second hole are respectively etching holes formed by dry etching, and height of scallops on a sidewall of the first hole is larger than height of scallops on a sidewall of the second hole such that the number of scallops on the sidewall of the first hole is less than the number of scallops on the sidewall of the second hole.

* * * * *